United States Patent [19]

Chiron et al.

[11] 4,265,512
[45] May 5, 1981

[54] OPTOELECTRONIC CONVERTING TERMINATION FOR OPTICAL-FIBRE TRANSMISSION CABLE

[75] Inventors: Bernard Chiron; Jean-Louis Foure; Michel de Vecchis, all of Paris, France

[73] Assignee: Societe Lignes Telegraphiques et Telephoniques, Paris, France

[21] Appl. No.: 16,810

[22] Filed: Mar. 2, 1979

[51] Int. Cl.³ .................................................. G02B 5/16
[52] U.S. Cl. ................................ 350/96.20; 250/227
[58] Field of Search ................ 350/96.20; 250/227, 250/551; 357/17, 18, 19

[56] References Cited

U.S. PATENT DOCUMENTS

| | | | |
|---|---|---|---|
| 3,966,299 | 6/1976 | Osterfield et al. | 350/96.21 |
| 3,987,300 | 10/1976 | Palmer | 250/227 |
| 4,110,000 | 8/1978 | Bogar et al. | 350/96.21 |

FOREIGN PATENT DOCUMENTS

2420777 10/1979 France.

*Primary Examiner*—Stewart J. Levy
*Attorney, Agent, or Firm*—Robert A. Ostmann

[57] ABSTRACT

The electro-optic converter is designed to terminate optical fiber cables consisting of a mechanical core surrounded by a helically grooved sheath in which an optical fibre is loosely placed in the grooves. It consists of an hybrid circuit conversion matrix made of a substrate with a central bore cooperating with a bore in a standard multi-pin casing base for positioning the cable core; a star shaped conductive film on said substrate serves as a common electrode for the plurality of discrete opto-electronic devices also connected each to a different pin of the base and in centering and locking means for the cable.

5 Claims, 7 Drawing Figures

Fig:6

OPTOELECTRONIC CONVERTING TERMINATION FOR OPTICAL-FIBRE TRANSMISSION CABLE

BACKGROUND OF THE INVENTION

The present invention concerns communications utilising optical fibres as an information vehicle and more particularly optoelectronic conversion devices necessary at the ends of the optical fibre cable.

The existence of cables comprising a number of independent optical fibres, such as those described in U.S. application Ser. No. 18, 269, filed Mar. 7, 1979, and assigned to the same Assignee as the instant application necessitates multi-access signal conversion devices for simultaneously processing the signals carried by each of the optical fibres in the cable. In order to fully grasp the problem reference is made to FIGS. 1a and 1b which show transverse and longitudinal sections, respectively, of a cable element described in the aforesaid Patent application. It consists of a central metal core 1 surrounded by a dielectric star profiled sheath 2 formed with helical grooves 4 of V-shaped profile, which in extruded onto core 1. After the optical fibres 6 have been laid in the grooves 4, a taping 5 closes the grooves. The optical fibres 6 are allowed sufficient freedom to avoid stresses which are likely to cause attenuation. When the cable is limited to one element, it is protected by an envelope and sheating 7.

The present invention has for its object to provide a signal converter which is matched to a cable of the type just described.

SUMMARY OF THE INVENTION

The opto-electronic converter for terminating a cable with n optical fibers comprises:
an opto-electronic conversion matrix consisting of:
a base of a standard multi-pin casing
an insulating substrate in said base formed with a bore extending into the casing base along its axis of symmetry the said substrate being partially covered by an annular metallisation electrically connected to the base and having a star-shaped external contour and an internal contour in the form of a convex regular polygon with n sides and the same symmetry axis as the casing base,
n discrete opto-electronic components, each having at least one electrode connected to the metallisation and one electrode connected to an insulated pin through the base.
means for centering the core of the cable in relation to the matrix,
means for fixing the matrix on the cable.

The opto-electronic converter according to the invention preferably constitutes part of a connector which can be used under the conditions usually existing at a cable-laying field. In a variant, the opto-electronic matrix may be mounted on one end of the cable in the factory.

The converter according to the invention has the following advantages:

When it constitutes a connector element the jointing does not involve any delicate operation, such operations having previously been carried out in the factory by specialists having available means which are necessary for the purpose of the required precision, and the positioning of the converter involves only techniques which can readily be applied on the field, the dimensions of the converters are adapted to the diameter of the cable; this feature is particularly useful when the cable consists of a number of elements of the type illustrated in FIG. 1, in the case of a breakdown (breakage of a fibre, failure of an opto-electronic device), the matrix may be replaced on the field without any action on the cable, the interconnection of the converters consists merely to plug the standard casing into the matching support mounted in the terminal equipment.

In the variant where the converter is directly mounted with the two cable ends in the factory, the equivalent of a cord of conductors terminated by two standard plugs is obtained.

BRIEF DESCRIPTION OF THE DRAWINGS

The invention will be readily understood from the following description, accompanied by FIGS. 1 to 7, which are given by way of non-limiting illustration and in which:

FIGS. 2 and 3 are two overhead views of the conversion matrix, one for transmission and the other for reception.

DETAILED DESCRIPTION

Figure 1:
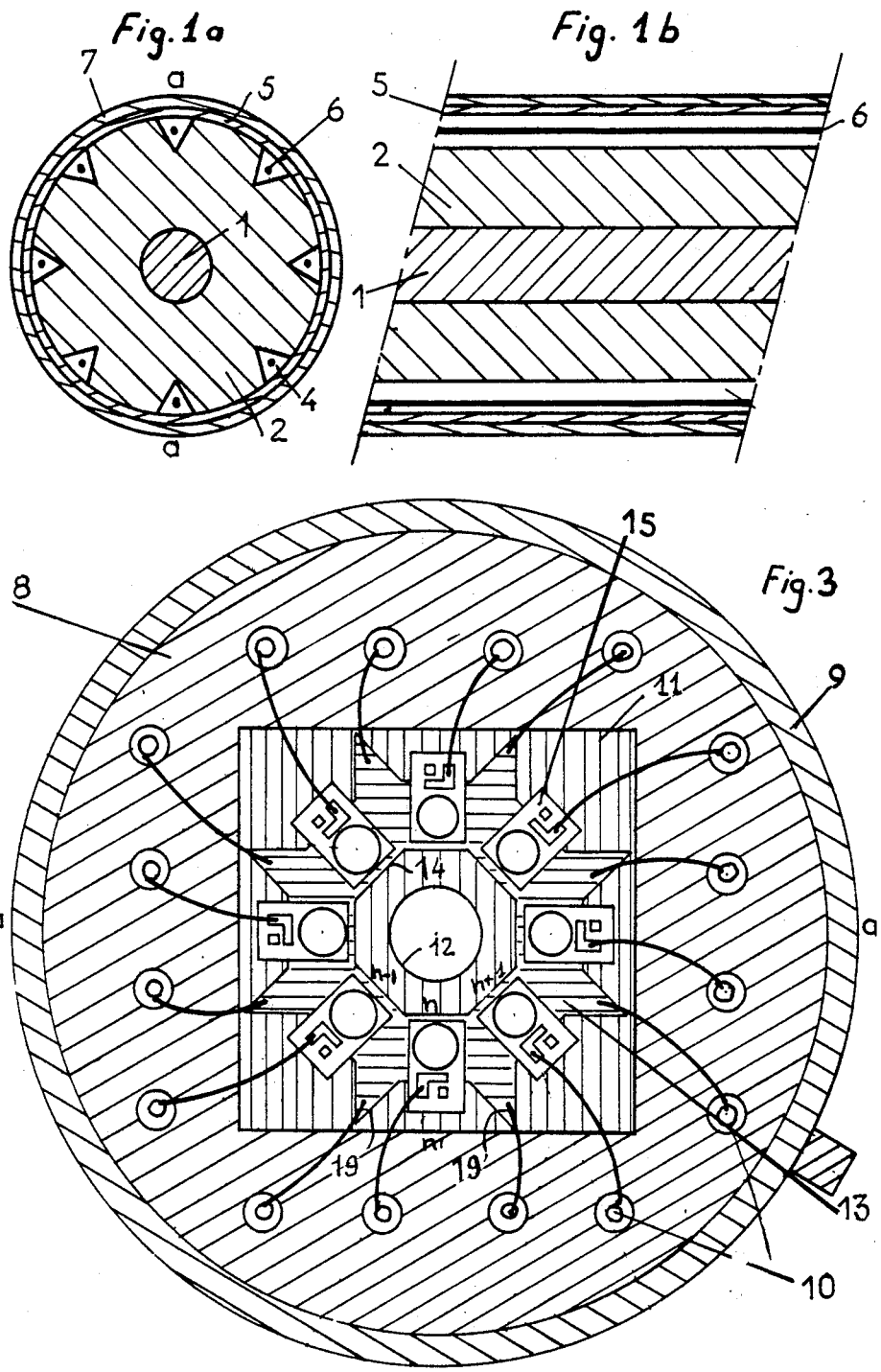
FIGS. 1a and 1b are two perpendicular sections through an optical-fibre cable with which the converter of the invention is matched.

FIGS. 1a and 1b have already been described.

Figure 2:
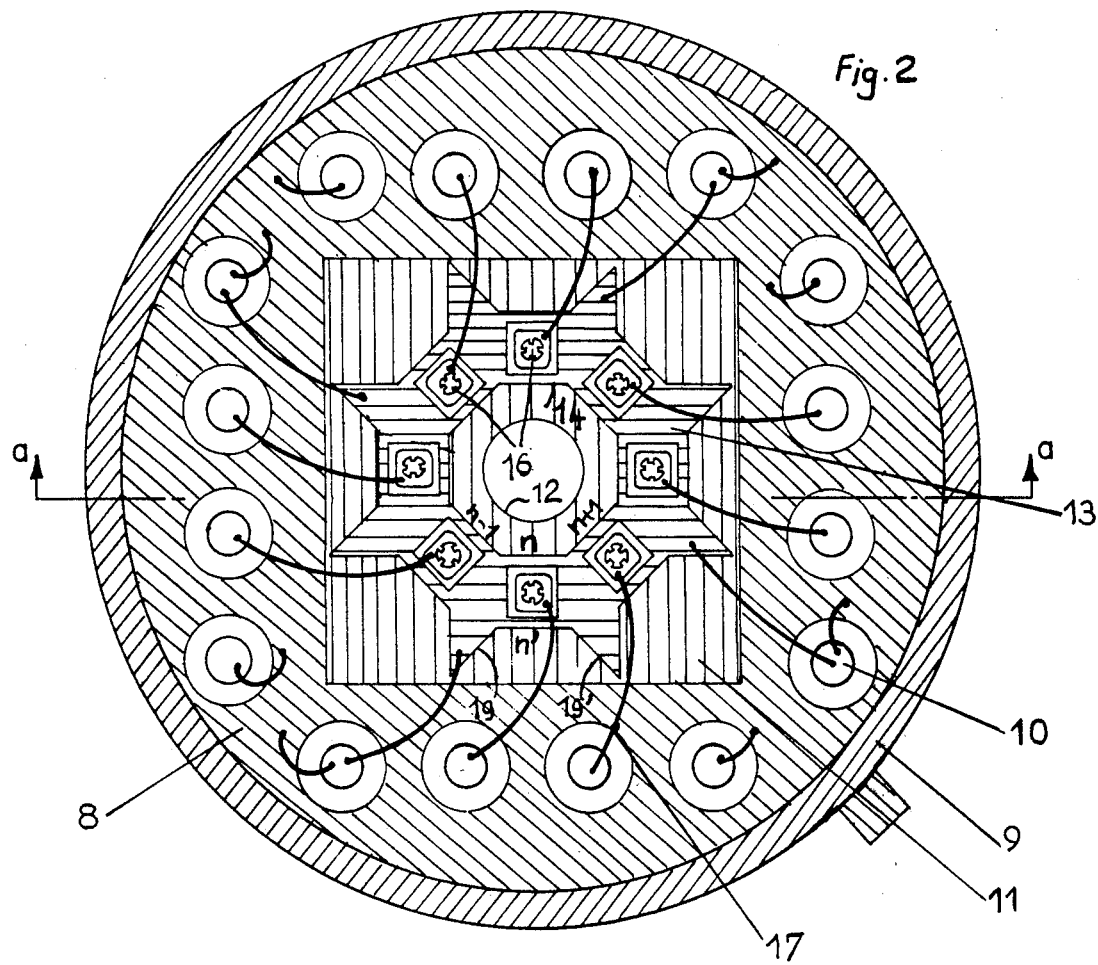
Figure 4:
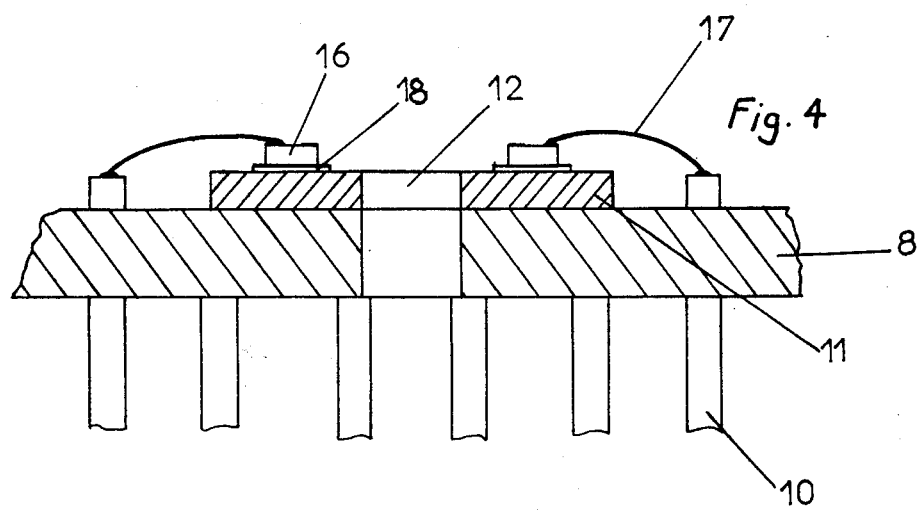
FIG 4 is a sectional view of a conversion matrix.

FIGS. 2 and 3 are two overhead views of reception and transmission matrix respectively comprising a base 8 terminated by a metallic ring 9. The base 8 is the base of a standard casing having the number of insulated pins 10 necessary for operating the optoelectronic devices, respectively photo-transistors 15 and photo-diodes 16. A square substrate 11, for example of alumina, is adhesively bonded to the base 8 so that its centre of symmetry is located on the axis of symmetry of the base 8. The said substrate is formed with bore 12 in registration with a bore extending axially through the base 8. Its upper face is coated with a conductive film 13, for example of gold, of which the degree of symmetry is fixed by the number of opto-electronic components 15-16 required that is to say, by the number of optical fibres in the associated cable. In the example chosen by way of illustration, this number is eight, it being understood it is just an example. The shape of the film is that of a star internally bounded by a regular polygon 14, which has a number of sides equal to the number of optical fibres in the cable. The external contour of the film 13 is designed by successively applying to each of the sides of the polygon 14 the following rule : to any side n of polygon 14 corresponds a side n' of the external contour of the film parallel to n and the extensions of the adjacent sides n−1 and n+1 cross at a point which fixes the centre of the associated opto-electronic component and are extended so as to define one side of the adjacent arms 19 and 19' respectively of a star which are located on either side of n'. Side n' is entirely occluded by the component both in FIGS. 2 and 3. This shape is particularly advantageous in that it facilitates the mounting of the components 15 and 16 on the base, since the marks constituted by the sides of the internal polygon 14 permits precise positioning of the components by optical sighting from a binocular magnifying glass. In the FIG. 2, the opto-electronic components 16 are AsGa light-emitting diodes (sending end), in FIG. 3, the components 15 are photo-transistors (receiving end). The type of the opto-electronic component 15 or 16 on a base depends on the connection afforded by the associated fibre and both components 15 and 16 may be mounted on the same substrate. The diodes 16 on the base of FIG. 2 are, for example, produced as described in French Pat. No. 2,287,776 filed Oct. 9, 1974. These light-emitting diodes are mounted on their non-photosensitive face on a preform consisting of AuGe alloy, for soldering on the film 13. In a preferred embodiment of the invention, (cf. FIG. 4) each of the diodes is soldered to a second Molytab preform 18 before soldering to the film. The pellets 18 permit individual monitoring of the operation of each of the diodes before they are mounted. Gold leads 17 provide the connections between the insulated pins 10, the components 16 or 15 and the film 13. The contact is achieved by thermocompression in the usual manner. In FIG. 2, the plane of FIG. 4 is represented by the line a—a. FIG. 3 illustrates a reception base on which the opto-electronic components are photo-transistors 15, they are substituted by photo-diodes when it is necessary to increase the maximum operating frequency. The transistors which may be used are of the type LS400 supplied by Texas Instruments Inc. when the signals transmitted along the fibres have a frequency below a few 100 KHz and photo-diodes of the type HP4207 supplied by Hewlett-Packard at higher frequencies. In FIG. 3, the bases of the photo-transistors in optical connection with the fibre are presented by a circle. They have floating potential. The emitters are connected by the wires 17 to the output pins 10 of the base. The collectors are maintained at the reference potential of the film 13 in the usual manner.

FIG. 4 is a sectional elevational view of a matrix composed of the base 8 and of the substrate 11. The film 13 cannot be seen. The sectional plane chosen passes through two pellets 18 and through the components 16 mounted thereon, and they are each connected to one of the insulated pins 10 by the thermocompressed wires 17.

The matrix of FIG. 2 was designed to operate with a cable having a diameter of 6 millimetres which has an extruded dielectric sheath 2 having a diameter of 4 millimetres, comprising eight optical fibres 125 micromeres in diameter, such as described in the U.S. application Ser. No. 18,269, mentioned earlier, and assigned to the same Assignee as the instant application. The base 8 employed in this matrix is that of standard casing F 136 having sixteen insulated pins. Substrate 11 fixed on the base has a side of 7 millimetres; the central bore 12 has a diameter of 2 millimetres. The annular metallised surface 13 is a gold film bounded by an internal octagon 14 having sides of 1.2 millimetres. The external contour of film 13 is obtained by drawing parallels at 1.2 millimetres from each of the sides of the octagon 14 and extending the sides themselves as indicated in the foregoing. The pellets fixed on the metallised surface 13 have a square form with sides of 0.73 millimetre and a thickness of 0.5 millimetre. These pellets support a TI XL06 photo-diode supplied by Texas Instruments Inc.

Figure 5:
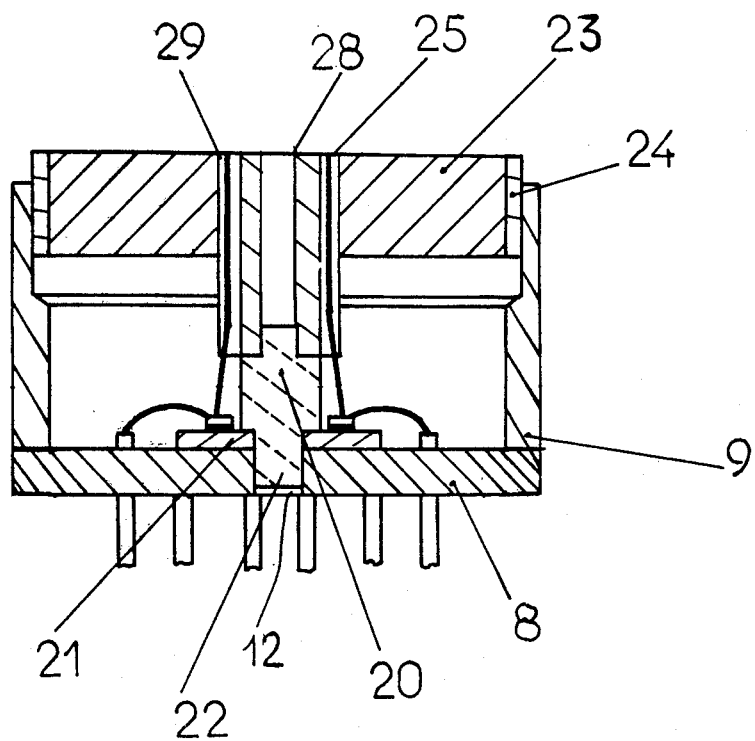
FIG. 5 is a sectional view of a variant of a conversion matrix according to the invention.

FIG. 5 is a longitudinal sectional view of a converter comprising a rigid end member 28, for example of ceramic material or of hard plastics, and a sleeve 23 consisting of flexible plastics, for example silastene, fitted into a metal ring 24 formed with flattopped teeth penetrating into grooves in the end member. The end member 28 has grooves 29 co-operating with those of the cable sheath, each of which contains an optical fibre 25 adhesively bonded to the photo-sensitive surface of the associated component and terminating flush with its free end. The other end of the end member 28 is fast with a fitted-on and adhesively bonded centering stud 20 formed with a shoulder 21 which abuts the substrate 11 and a centering dog force-fitted into the aperture 12. The ring 24 is held fast by adhesive bonding on the metal ring 9 surrounding the base 8 on which the matrix is mounted. When the assembly of the converter has been completed, a temporary protective cap (not shown in FIG. 5) is fitted on to the ring 9 to protect the free end of the end member 28.

A converter incorporating the conversion matrix described in the foregoing, was designed which has a diameter equal to 15 millimetres and a length from the base to the end of the end member supporting the optical fibres equal to 18 millimetres.

Figure 6:
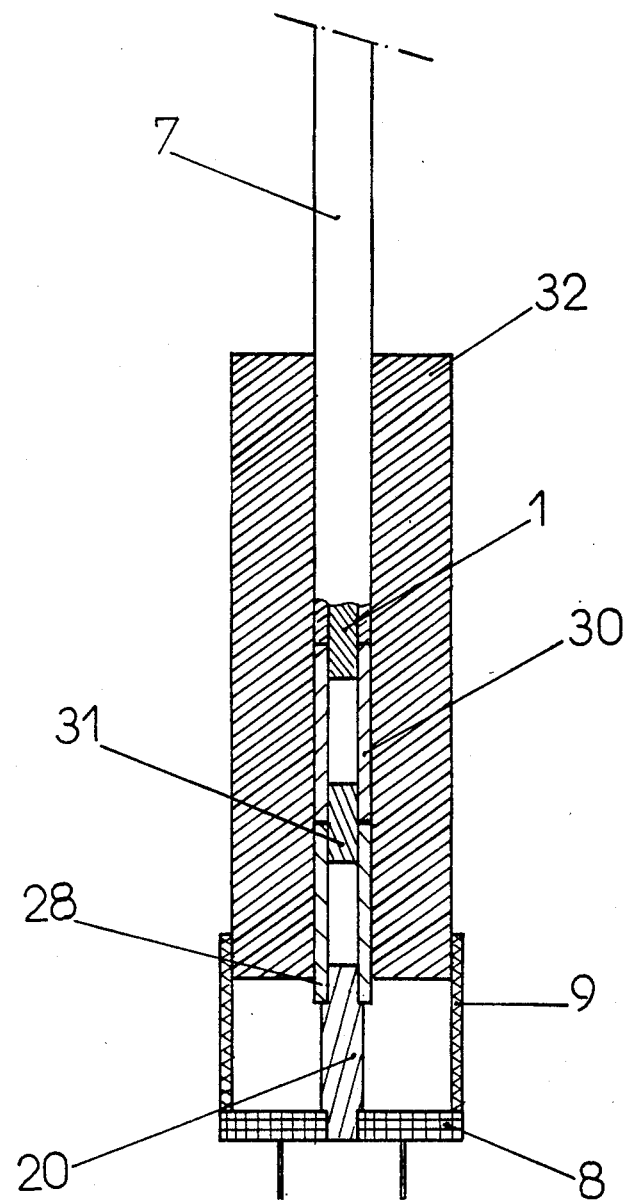
FIG. 6 illustrates the conversion matrix of FIG. 5, connected to the end of an optical-fibre cable.

FIG. 6 illustrates the connection of a cable to a converter according to FIG. 5. The end of the cable is associated with a connecting means of the type described in the French patent application No. 78 086 97, filed on Mar. 24, 1978, by the Assignee of the instant application and published under U.S. Pat. No. 2 420 777. In order to simplify the diagram, 32 represents the mechanical parts used for the locking. They comprise two locking cones associated with a sleeve, of which the end situated on the side of the converter performs the function of the sleeve 23 as illustrated in FIG. 5. The centering of the matrix in relation to the cable is effected as follows. The cable core is stripped by removal of the sheathing 7 and of the optical-fibre support 2, 1 is centered in an extension member 30 which reproduces the grooves 4 of sheath 2. The diameter of 30 is equal to that of the end member 28 centered in relation to the base 8 of the matrix by stud 20. Situated at the upper end of 28 and partially force-fitted is a cylindrical centering member 31 which penetrates, also with a force fit, into the lower part of the extension member 30. The optical fibres (not shown) of the cable are engaged in the grooves of the extension member 30 and of the end member 28. They are maintained in these grooves by a set of alignment rods (not shown). The centering of the cable in relation to the base is effected by the set of elements 20 - 28 - 31 - 30 - 1 and alignment rods. The ends of the fibres, after having been made flush, are fixed on the photosensitive surface of the components of the matrix, for example by adhesive bonding. Good results from the viewpoint of index matching have been obtained using the silastene adhesive agent manufactured by the company Rhone-Poulenc. A fitting incorporating the converter was designed which has a total length equal to 40 millimetres and a maximum diameter equal to 15 millimetres. The converter may be associated with or dissociated from the cable by operations which can be readily performed in the field.

Figure 7:
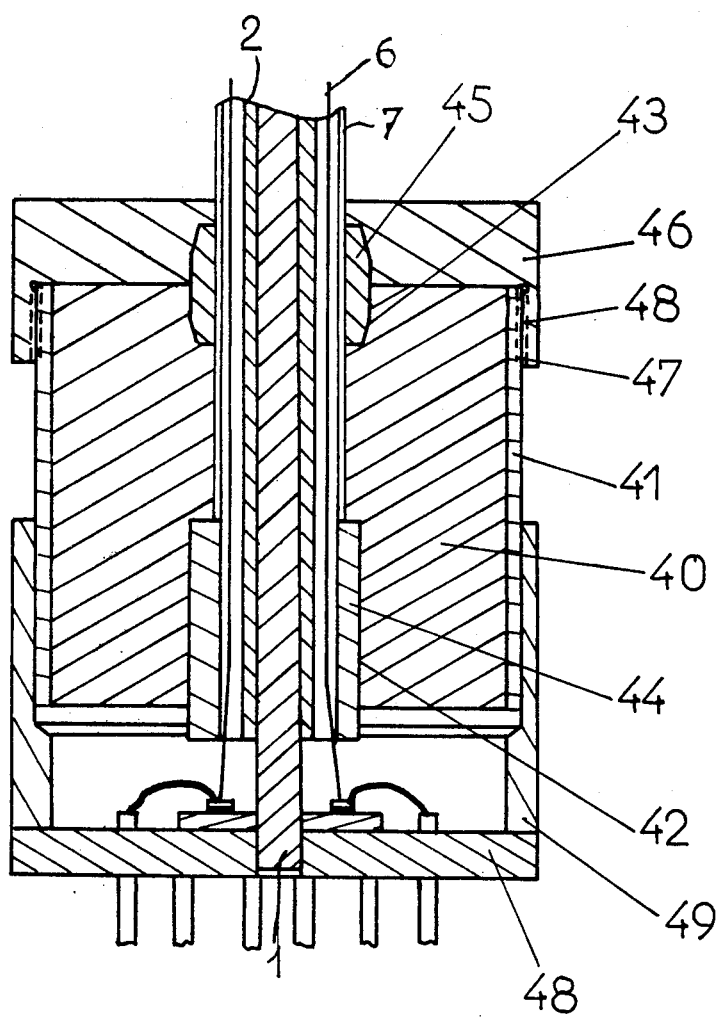
FIG. 7 illustrates a second variant of a conversion matrix according to the invention fixed to a cable.

FIG. 7 illustrates the end of an optical-fibre cable permanently terminated by a converter. Fixing the conversion matrix to the end of the optical-fibre cable has been simplified. Metal ring 49 having the same diameter and the same length as the ring 9 described in the foregoing surrounds the casing base 48. Sleeve 40 consists of plastics which is fitted into a metal ring 41, one end of which enters with greasy friction the ring 49 and the other end of which has a screwthread 47. The converter side end of sleeve 40 shows a cylindrical recess 42 having the same axis as the base 48 and as the stripped end 1 of the cable which enters a central aperture in the base as has been explained in the foregoing. The ring 44 of flexible plastics (silastene) which limits the displacements of the optical fibre 6 to those permitted by the grooves 4 of the cable occupies the recess 42. Its inside face is formed with teeth reproducing the form of the grooves, of which the apex is omitted so as to afford passage to the fibres at the bottom of the groove. The end of the sleeve 40 which is further from the converter has a groove 43 intended to receive a packing of resilient material, for example silastene, which surrounds the cable and is intended to hold it fast in the fitting when it is compressed by the packing clamp 46, of which the screwthread 48 engages at 47. The positioning takes place when the ends of the optical fibres have been adhesively bonded on the photo-sensitive zones of the photo-sensitive components by bringing the ring 44 and the metal ring 41 containing the sleeve 40 into their final position. The ring 41 is made fast in relation to the ring 49, for example by adhesive bonding, whereafter the packing is introduced into the recess 43 and locked with the aid of the packing clamp 46. The various members have previously been threaded on to the end of the cable in the usual manner.

The dimensions of a fitting designed for the above 8 fibre cable are as follows:

length 12 millimetres from the base to the packing clamp diameter 15 millimetres.

What we claim:

1. An optoelectronic converting termination for an n-optical fibre transmission cable including a mechanical core, a surrounding grooved sheath and a fibre laid in each groove of the sheath, the termination comprising
   a. a base having a plurality of pins and containing a first bore;
   b. an insulating substrate fixed on the base and containing a second bore extending along the axis of the first bore;
   c. an annular conductive film on the substrate and having an internal contour in the form of a convex, regular, n-sided polygon centered on the axis of the first bore; and
   d. n discrete optoelectronic components, each having at least a first electrode connected to the film and a second electrode connected to one of the pins,
   e. each of said components being positioned on the film at the point of intersection of extensions of two-sides of said polygon which are adjacent a common side of the polygon.

2. A converting termination as defined in claim 1 which includes n conductive metal pellets, one of the pellets being interposed between said film and each of said components.

3. A converting termination as defined in claim 1 which includes
   a. an end member formed with grooves cooperating with those in the cable sheath and having a free end and an opposite end;
   b. a centering stud fixed to said opposite end of the end member and fitted into the bores in the substrate and the base;
   c. a length of optical fibre disposed in each groove of the end member, the fibres terminating flush with the free end of the end member at one of their ends and being mounted on photosensitive surfaces of said components at their opposite ends;
   d. a ring mounted on the periphery of the base; and
   e. a sleeve attached to the ring and serving as a male fitting for a junction with the cable.

4. A converting termination as defined in claim 1 which includes
   a. a length of the mechanical core of the cable which extends into the bores in the substrate and the base;
   b. a ring mounted on the periphery of the base;
   c. a sleeve fixed to the ring and to the sheath of the cable; and
   d. a flexible ring formed on its inner periphery with teeth having flattened ends which penetrate into the grooves of the cable sheat.

5. A converting termination as defined in any one of claims 1-4 in which said film has a star-shaped external contour.

* * * * *